(12) United States Patent
Lee et al.

(10) Patent No.: US 10,841,676 B2
(45) Date of Patent: Nov. 17, 2020

(54) INNER MODULE ASSEMBLY FORMED BY A METAL TAPE

(71) Applicant: CONCRAFT HOLDING CO., LTD., Grand Cayman (KY)

(72) Inventors: Chin-Hsing Lee, New Taipei (TW); Jin-Bo Peng, Kunshan (CN); Chang-Hsien Tung, New Taipei (TW)

(73) Assignee: CONCRAFT HOLDING CO., LTD., Grand Cayman (KY)

( * ) Notice: Subject to any disclaimer, the term of this patent is extended or adjusted under 35 U.S.C. 154(b) by 63 days.

(21) Appl. No.: 16/366,089

(22) Filed: Mar. 27, 2019

(65) Prior Publication Data
US 2020/0204892 A1    Jun. 25, 2020

(30) Foreign Application Priority Data
Dec. 20, 2018    (TW) .............................. 107146202 A

(51) Int. Cl.
| H05K 1/00 | (2006.01) |
| H04R 1/02 | (2006.01) |
| H05K 1/02 | (2006.01) |
| H04R 1/10 | (2006.01) |

(52) U.S. Cl.
CPC .......... *H04R 1/028* (2013.01); *H04R 1/1058* (2013.01); *H05K 1/0213* (2013.01); *H04R 2420/07* (2013.01)

(58) Field of Classification Search
CPC ............. H05K 1/142; H05K 2201/045; H05K 2201/1039; H04R 1/025; H04R 3/00
See application file for complete search history.

(56) References Cited

U.S. PATENT DOCUMENTS

| 9,548,787 B1* | 1/2017 | Lee .......................... H01Q 1/44 |
| 2010/0066619 A1* | 3/2010 | Furumura ............ H01Q 1/2283 343/742 |
| 2015/0017836 A1* | 1/2015 | Wu ..................... H01R 13/6658 439/620.21 |

\* cited by examiner

*Primary Examiner* — Pete T Lee
(74) *Attorney, Agent, or Firm* — Muncy, Geissler, Olds & Lowe, P.C.

(57) ABSTRACT

An inner module assembly formed by a metal tape is installed primarily inside a wireless earphone. The inner module assembly includes a circuit loop having a first circuit board and a second circuit board, with the circuit loop being formed with plural junctions; a first metal tape which fixes the second circuit board and includes a first extension section extending to the outside of the second circuit board and having a first cut-off face; and an insulation seat which is formed on the first circuit board to enclose the circuit loop and the first metal tape, with part of the junctions and the first cut-off face being exposed on a surface of the insulation seat. Therefore, the inner module assembly is formed into a modularized design to simplify the assembly procedure of the wireless earphone.

10 Claims, 8 Drawing Sheets

INNER MODULE ASSEMBLY FORMED BY A METAL TAPE

BACKGROUND OF THE INVENTION a) Field of the Invention

The present invention relates to an inner module assembly formed by a metal tape, and more particularly to an inner module assembly which is installed inside a wireless earphone by a modularized design and is able to reduce the assembly cost significantly.

b) Description of the Prior Art

An earphone is connected to an electronic device, so as to transmit the sound played by that electronic device to a user's ears. An ordinary earphone includes a wired earphone and a wireless earphone (such as the AIRPODS issued by the Apple, Inc.), wherein the wired earphone is connected to the electronic device through a wire, and the wireless earphone is connected to the electronic device through a wireless communication technology such as Bluetooth.

As the wired earphone must use a wire to connect to the electronic device, the range of use is limited. In addition, the wired earphone can be pulled and stretched easily due to the existence of wire, and the wire can be easily intertwined upon collecting the wired earphone. On the other hand, as the wireless earphone transmits the sound through the wireless communication technology, the range of use is farther than that of the wired earphone, and is without the problem of easy pulling and stretching or intertwining of the wire. Therefore, the wireless earphone has been replacing the wired earphone gradually.

For an ordinary earphone, in addition to that its exterior is enclosed by a casing, the interior is usually provided with a circuit board, and a loudspeaker; whereas, the interior of the wireless earphone should be further provided with a battery, a microphone and a wireless communication module. As a wireless earphone has more internal parts, when the ordinary wireless earphone is being assembled, the circuit board, the loudspeaker, the battery, the microphone, and the wireless communication module should be installed and fixed inside the casing orderly. Therefore, it will require a lot of manpower to assemble the wireless earphone, which increases the labor cost. Furthermore, as the wireless earphone is small in size, the internal space of assembly is limited, which can easily damage the parts by carelessly assembling, thereby decreasing the yield of assembly.

Accordingly, the technical means and the object thereof to be solved by the present invention are the provision of an inner module assembly which is installed inside a wireless earphone by a modularized design and is able to reduce the assembly cost significantly.

SUMMARY OF THE INVENTION

The primary object of the present invention is to provide an inner module assembly formed by a metal tape, and more particularly to an inner module assembly which is installed inside a wireless earphone by a modularized design and is able to reduce the assembly cost significantly.

To achieve the aforementioned object, the present invention discloses an inner module assembly formed by a metal tape, comprising a circuit loop, at least a first metal tape and at a least an insulation seat. The circuit loop includes at least a first circuit board and at least a second circuit board which is extended from the first circuit board, with plural junctions being formed on the first circuit board and the second circuit board respectively. The first metal tape is used to fix the second circuit board, forming an angle between the second circuit board and the first circuit board. In addition, the metal tape is provided at least with a first extension section which is extended to the outside of the second circuit board, with a first cut-off face being formed on the first extension section away from an edge of the second circuit board. The insulation seat encloses the circuit loop and the metal tape, and is formed integrally on the first circuit board by injection molding, allowing part of the junctions on the circuit loop and the first cut-off face of the first extension section to be exposed on a surface of the insulation seat.

In an embodiment, the insulation seat includes a bottom plate to enclose the first circuit board, and a first side wall which is extended from the bottom plate to enclose the second circuit board and the first metal tape.

In an embodiment, the insulation seat further includes a second side wall which is extended from the bottom plate to oppose the first side wall, as well as a connecting wall which opposes the bottom plate and is connected between the first side wall and the second side wall, forming a holding space on the insulation seat.

In an embodiment, the inner module assembly is further provided with a power supply unit which is disposed in the holding space to connect electrically with the circuit loop.

In an embodiment, the inner module assembly is further provided with a loudspeaker which is connected electrically with the circuit loop, and the connecting wall of the insulation seat is further provided with a rabbet to install the loudspeaker.

In an embodiment, the circuit loop further includes a third circuit board which is extended from the first circuit board and is enclosed in the second side wall, with the third circuit board being connected electrically with the first circuit board.

In an embodiment, the inner module assembly further includes a second metal tape which is enclosed in the second side wall to fix the third circuit board.

In an embodiment, the second metal tape further includes at least a first extension section which is extended to the outside of the second circuit board, with a first cut-off face being formed on the first extension section away from an edge of the second circuit board to be exposed on a surface of the insulation seat.

In an embodiment, the inner module assembly further includes a metallic fixing plate which opposes the second metal tape, with the third circuit board being disposed between the second metal tape and the metallic fixing plate.

In an embodiment, the second metal tape is further extended with at least a snap part which avoids the third circuit board and the metallic fixing plate followed by being bent over, so that the third circuit board and the metallic fixing plate can be fixed on the second metal tape by the snap part.

In comparison to the prior arts, the inner module assembly used in the wireless earphone, according to the present embodiment, is provided with following advantages that:

1. Through the insulation seat, the circuit loop, the power supply unit and the loudspeaker can be integrated together in the inner module assembly, forming a modularized inner module assembly to reduce the labor cost of assembly significantly.
2. The shape of the insulation seat can be changed according to the configuration of the wireless earphone, so that the inner module assembly can be applied to the wireless earphones in various configurations.

To enable a further understanding of said objectives and the technological methods of the invention herein, a brief description of the drawings is provided below followed by a detailed description of the preferred embodiments.

DETAILED DESCRIPTION OF THE PREFERRED EMBODIMENTS

Figure 1:
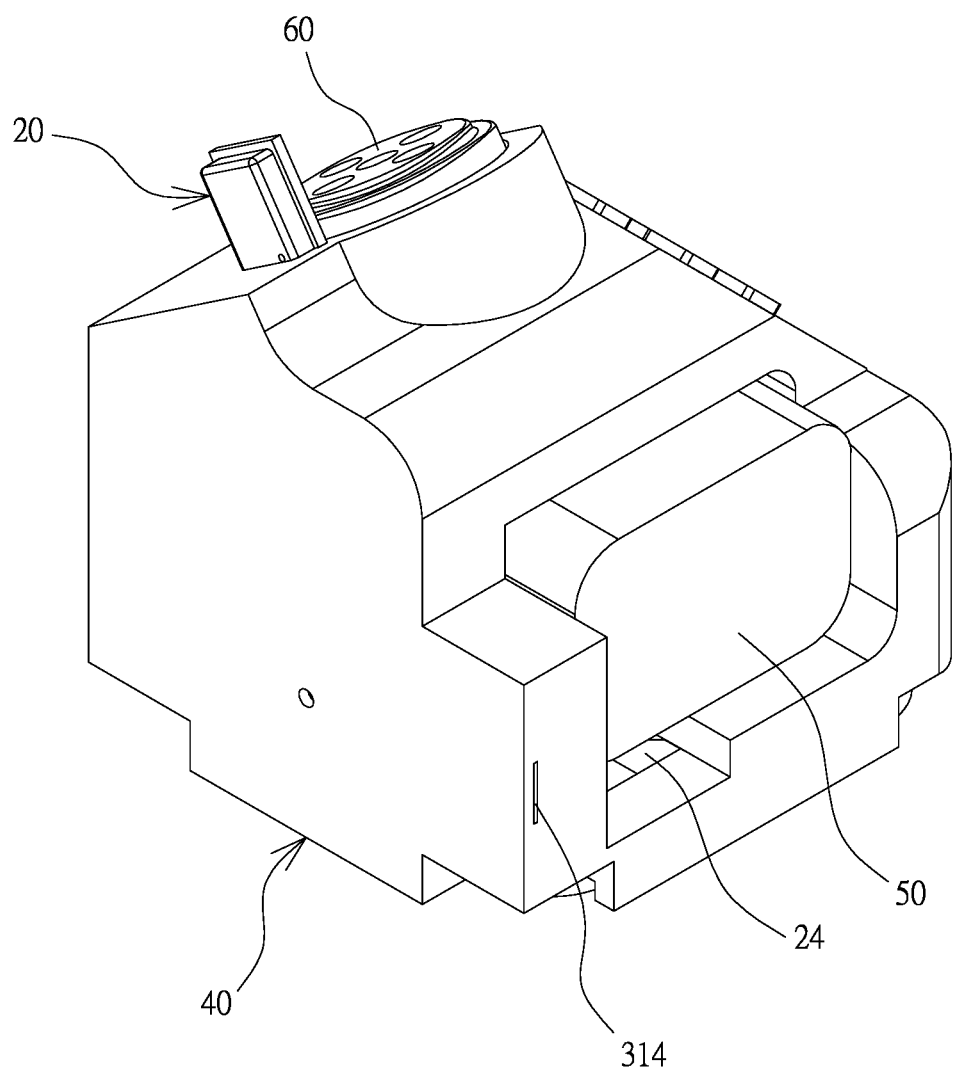
FIG. 1 shows a reference diagram at a first viewing angle of the present invention under use.
Figure 2:
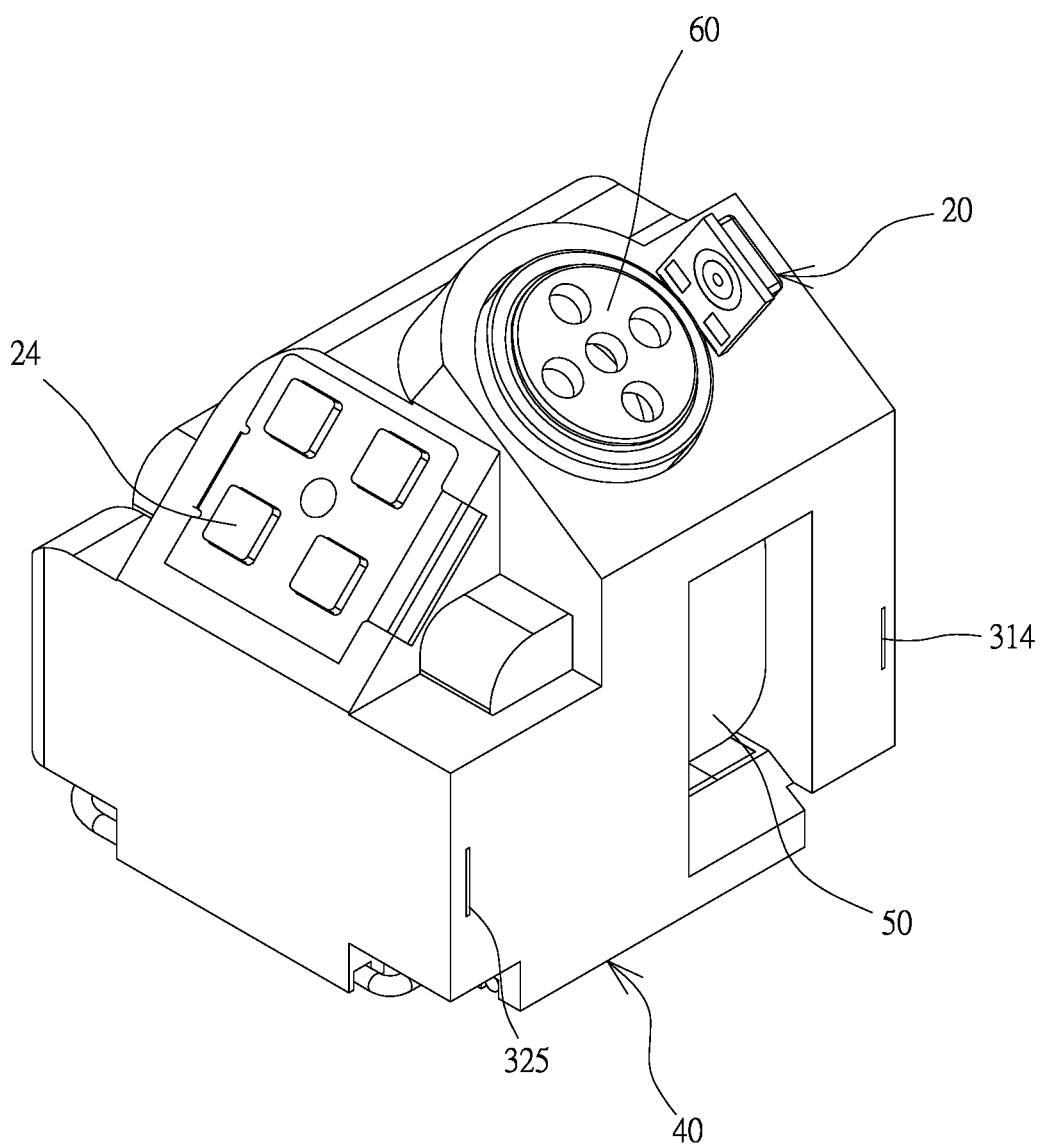
FIG. 2 shows a reference diagram at a second viewing angle of the present invention under use.
Figure 3:
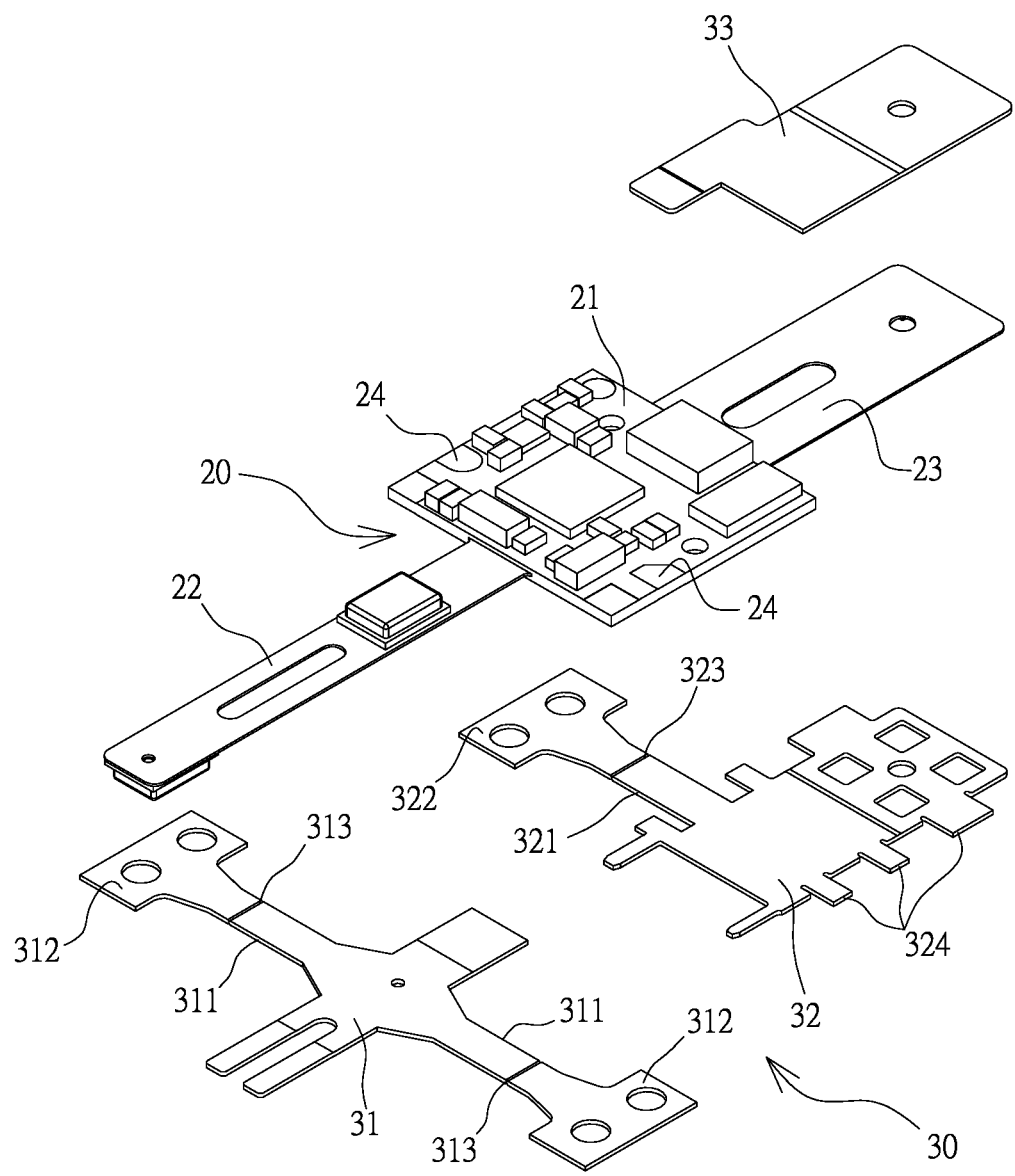
FIG. 3 shows an exploded view of a circuit loop and a metal tape in the present invention.
Figure 4:
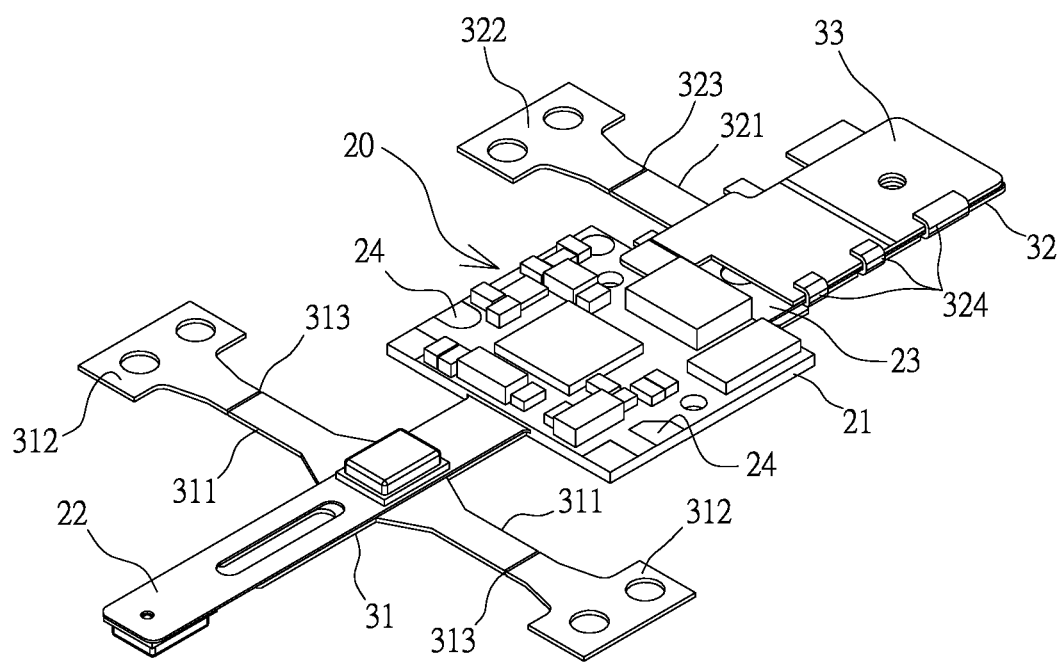
FIG. 4 shows an assembly view of the circuit loop and the metal tape in the present invention.
Figure 5:
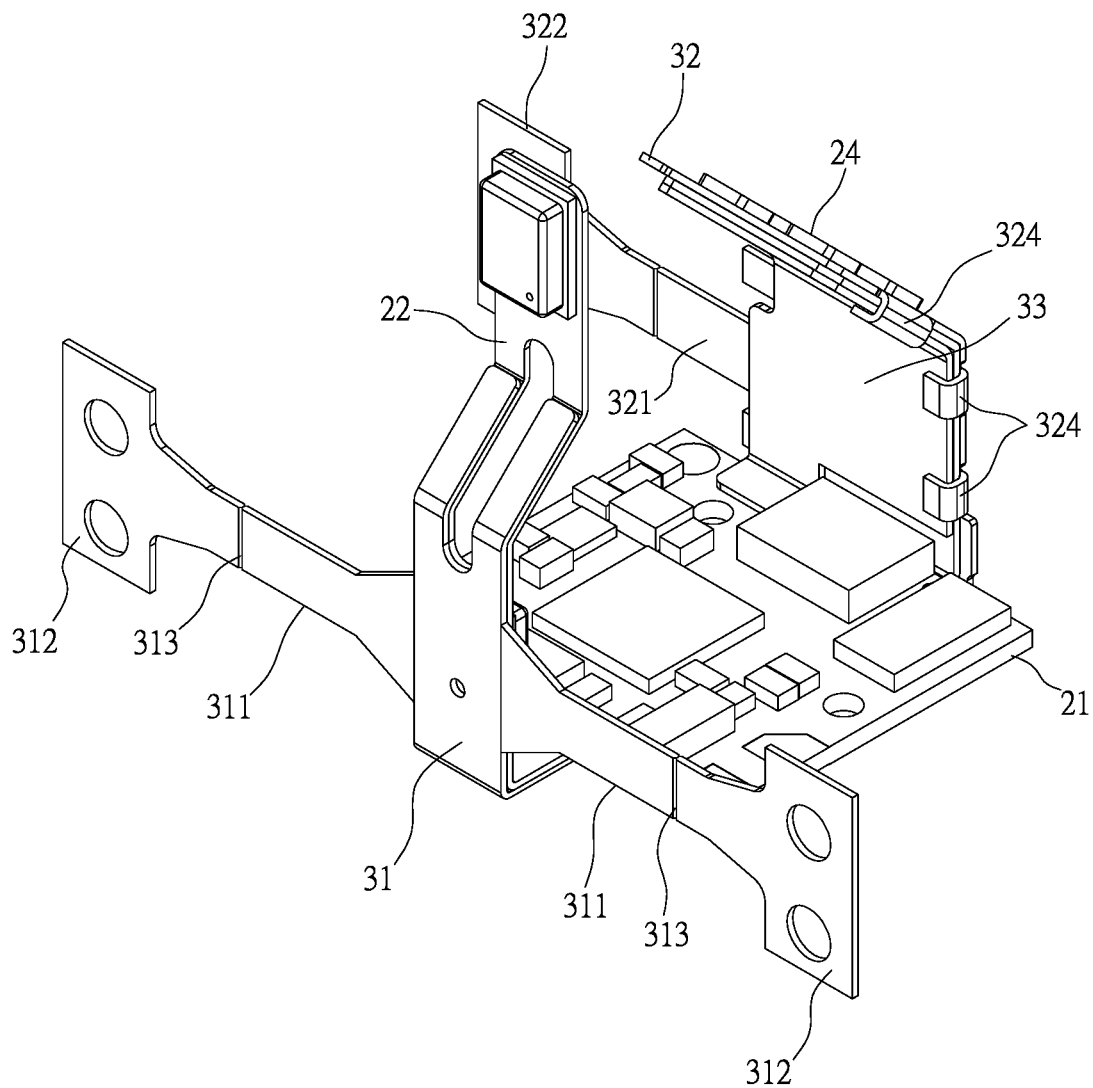
FIG. 5 shows a schematic view at a first viewing angle in the present invention after the circuit loop and the metal tape are bent over.
Figure 6:
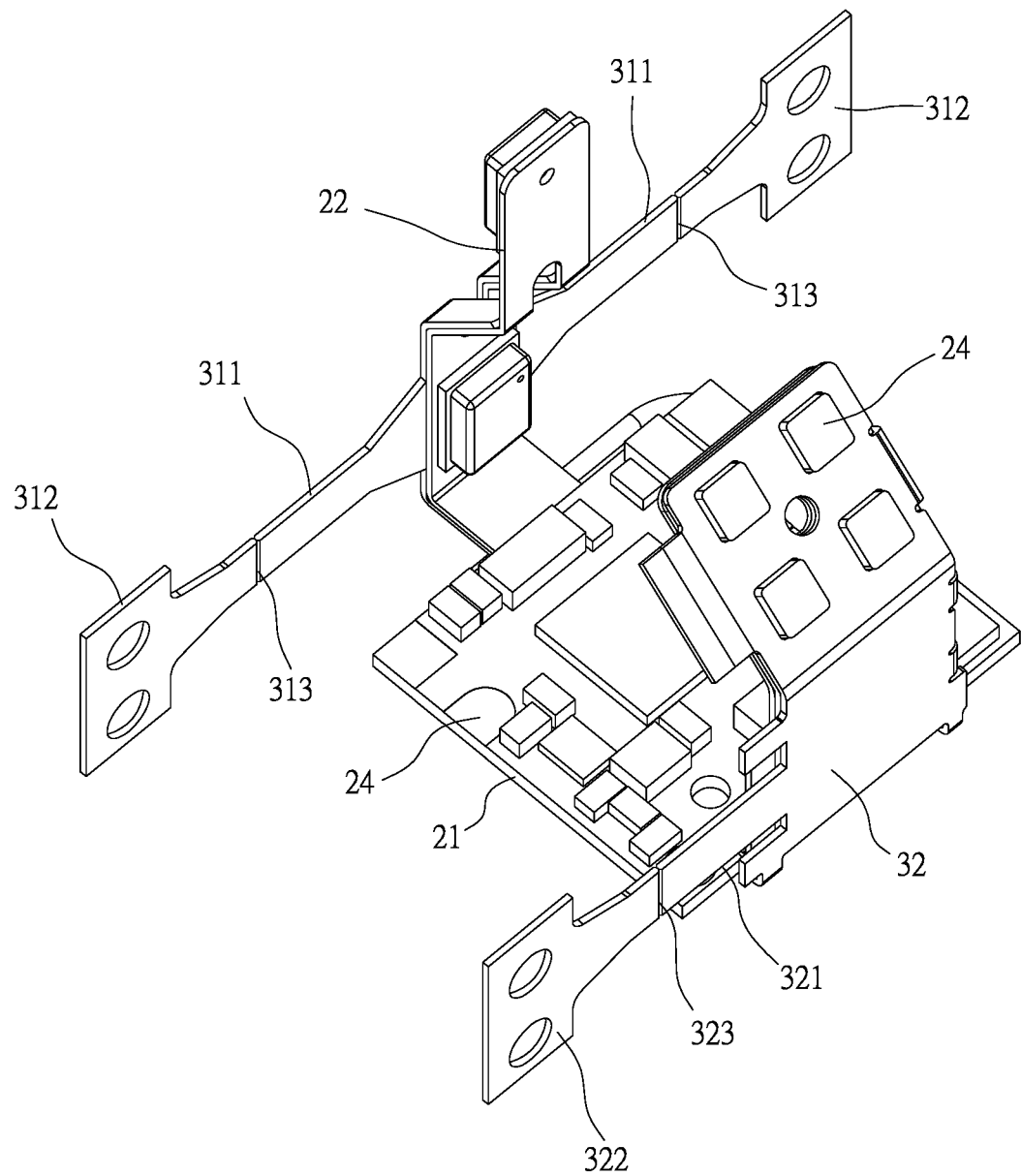
FIG. 6 shows a schematic view at a second viewing angle in the present invention after the circuit loop and the metal tape are bent over.
Figure 7:
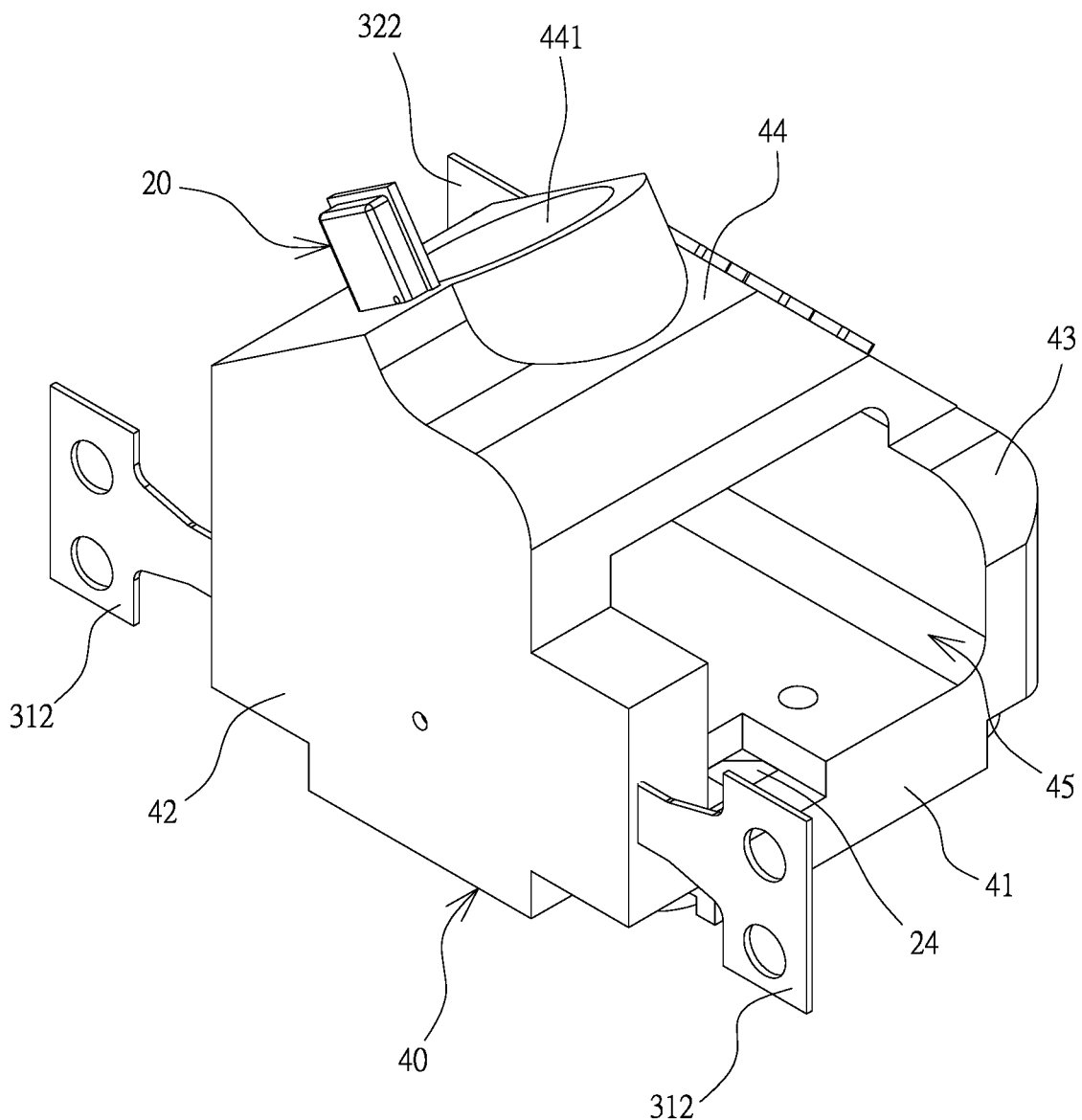
FIG. 7 shows a schematic view at a first viewing angle in the present invention after forming an insulation seat.
Figure 8:
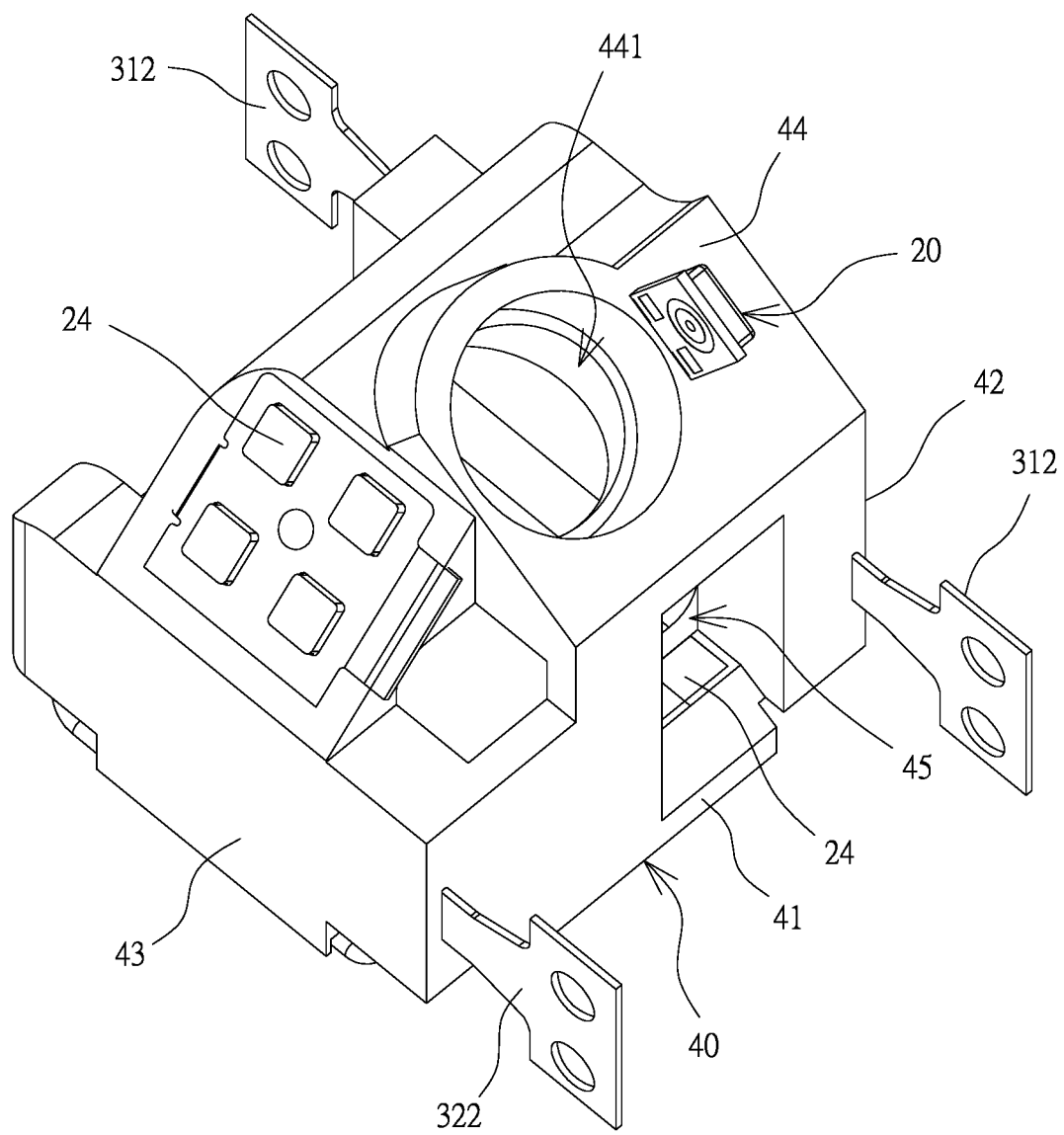
FIG. 8 shows a schematic view at a second viewing angle in the present invention after forming the insulation seat.

Referring to FIGS. 1 to 8, the present invention discloses an inner module assembly 10 formed by a metal tape. The inner module assembly 10 is installed inside a casing of wireless earphone (no further description is needed as it belongs to the prior art), and comprises a circuit loop 20, at least a metal tape 30, an insulation seat 40, a power supply unit 50 and a loudspeaker 60.

The circuit loop 20 is formed by a first circuit board 21, a second circuit board 22 and a third circuit board 23. The first circuit board 21 is a hard circuit board; whereas, the second circuit board 22 and the third circuit board 23 are soft circuit boards and are extended from two opposite sides of the first circuit board 21, enabling the second circuit board 22 to be opposite to the third circuit board 23. In addition to that the circuit loop 20 is assembled by the hard circuit board and the soft circuit boards, the circuit loop 20 can be also formed by the soft circuit boards alone or the hard circuit boards alone. Furthermore, the first circuit board 21, the second circuit board 22 and the third circuit board 23 are connected together electrically, and the circuit loop 20 is formed with plural junctions 24 which are disposed on the first circuit board 21, the second circuit board 22 and the third circuit board 23, respectively.

The metal tape 30 includes a first metal tape 31, a second metal tape 32 and a metallic fixing plate 33. The first metal tape 31 is used to fix the second circuit board 22, and the first metal tape 31 is provided at least with a first extension section 311 which is extended to the outside of the second circuit board 22. The other side of the first extension section 311 is connected with a first bridge 312, and a first cut-off part 313 is formed between the first extension section 311 and the first bridge 312. In the present embodiment, two opposite sides of the first metal tape 31 are extended respectively with a first extension section 311, and each first extension section 311 is extended with a first bridge 312. The second metal tape 32 is used to fix the third circuit board 23, and the second metal tape 32 is provided with a second extension section 321 which is extended to the outside of the third circuit board 23. The other side of the second extension section 321 is connected with a second bridge 322, and a second cut-off part 323 is formed between the second extension section 321 and the second bridge 322. The metallic fixing plate 33 is opposite to the second metal tape 32, enabling the third circuit board 23 to be disposed on the second metal tape 32 and the metallic fixing plate 33. To allow the third circuit board 23 to be fixed effectively between the second metal tape 32 and the metallic fixing plate 33, the second metal tape 32 is further provided at least with a snap part 324 which avoids the third circuit board 23 and the metallic fixing plate 33 followed by being bent over, so as to fix the third circuit board 23 and the metallic fixing plate 33 on the second metal tape 32.

The insulation seat 40 is formed integrally by injection molding, and is used to enclose the circuit loop 20 and the metal tape 30. The insulation seat 40 is formed primarily by emplacing the circuit loop 20 and the metal tape 30 into a mold (not shown in the drawings); whereas, before emplacing the circuit loop 20 and the metal tape 30 into the mold, the second circuit board 22 and the third circuit board 23 should be first made to pass through the first metal tape 31, with the second metal tape 32 and the metallic fixing plate 33 being bent over in advance, allowing the second circuit board 22 to be opposite to the third circuit board 23, as well as forming an angle between the second circuit board 22 and the first circuit board 21, and between the third circuit board 23 and the first circuit board 21 respectively. Next, the circuit loop 20 and the metal tape 30 are fixed in the mold by the first bridge 312 and the second bridge 322, followed by forming the insulation seat 40 in the mold by injection molding. Furthermore, the insulation seat 40 is made to encompass a bottom plate 41 which encloses the first circuit board 21, a first side wall 42 which is extended from the bottom plate 41 to enclose the second circuit board 22 and the first metal tape 31, a second side wall 43 which is extended from the bottom plate 41 to enclose the third circuit board 23, the second metal tape 32 and the metallic fixing plate 33 and is opposite to the first side wall 42, and a connecting wall 44 which is opposite to the bottom plate 41 and is connected between the first side wall 42 and the second side wall 43. In addition, the bottom plate 41, the first side wall 42, the second side wall 43 and the connecting wall 44 surround into a holding space 45 to dispose the power supply unit 50. On the other hand, when the bottom plate 41 is formed on the first circuit board 21, part of the junctions 24 on the first circuit board 21 will be exposed on the bottom plate 41. When the second side wall 43 is formed on the third circuit board 23, part of the junctions 24 on the third circuit board 23 will be exposed on the second side wall 43; whereas, when the insulation seat 40 is formed, the first bridge 312 and the second bridge 322 will be protruded out of the first side wall 42 and the second side wall 43, respectively. The connecting wall 44 is further formed with a rabbet 441 for disposing the loudspeaker 60.

After forming the insulation seat 40, the insulation seat 40 is taken out of the mold, and then, the two first bridges 312 that are connected at two sides of the first metal tape 31 as well as the two second bridges 322 that are connected on the second metal tape 32 are broken off from the insulation seat 40. When the two first bridges 312 are being broken off from the insulation seat 40, it is primarily that each first cut-off part 313 between every first bridge 312 and every first extension section 311 is broken off, so as to form a first cut-off face 314 on the connection surface between every first extension section 311 and every first bridge 312 after separating every first bridge 312 from every first extension section 311. The two first cut-off faces 314 are then exposed on the surface of the first side wall 42 of the insulation seat 40, respectively.

When the two second bridges 322 are being broken off from the insulation seat 40, it is primarily that each second cut-off part 323 between every second bridge 322 and every second extension section 321 is broken off, so as to form a second cut-off face 325 on the connection surface between the second extension section 321 and the second bridge 322 after separating the second bridge 322 from the second extension section 321. The two second cut-off faces 325 are then exposed on the surface of the second side wall 43 of the insulation seat 40, respectively.

Next, the power supply unit 50 is installed in the holding space 45, and the power supply unit 50 is made to connect electrically with part of the junctions 24 that are exposed on the bottom plate 41, allowing the power supply unit 50 to connect electrically with the circuit loop 20. Finally, the loudspeaker 60 is disposed in the rabbet 441 of the connecting wall 44, and the loudspeaker 60 is made to connect electrically with another part of the junctions 24 that are exposed on the bottom plate 41, allowing the loudspeaker 60 to connect electrically with the circuit loop 20. Accordingly, the inner module assembly 10 in the modularized design is accomplished.

It is worth mentioning that the shape of the insulation seat 40 can be designed according to the configuration of the wireless earphone, to fit with the inner space of the wireless earphone, so that the inner module assembly 10 can be installed in the wireless earphone directly. Accordingly, the inner module assembly 10 is formed in advance into a modularized design, and the inner module assembly 10 is integrated with the power supply unit 50 and the loudspeaker 60. Thus, the inner module assembly 10 of the present invention can be installed in the wireless earphone directly, which simplifies the assembly procedure of the wireless earphone considerably and reduces the labor work of assembly significantly, thereby achieving the effect of lowering the assembly cost.

It is of course to be understood that the embodiments described herein is merely illustrative of the principles of the invention and that a wide variety of modifications thereto may be effected by persons skilled in the art without departing from the spirit and scope of the invention as set forth in the following claims.

What is claimed is:

1. An inner module assembly formed by a metal tape, comprising a circuit loop, which is provided with a first circuit board, and a second circuit board extending from the first circuit board, with plural junctions being formed on the first circuit board and the second circuit board, respectively;
   a first metal tape which is used to fix the second circuit board, forming an angle between the second circuit board and the first circuit board, with the first metal tape being provided with a first extension section extending to an outside of the second circuit board, and a first cut-off face being formed on the first extension section away from an edge of the second circuit board; and
   an insulation seat which encloses the circuit loop and the first metal tape, with the insulation seat being formed integrally on the first circuit board by injection molding, whereas part of the junctions on the circuit loop and the first cut-off face of the first extension section being exposed on a surface of the insulation seat.

2. The inner module assembly formed by a metal tape, according to claim 1, wherein the insulation seat includes a bottom plate to enclose the first circuit board, and a first side wall which is extended from the bottom plate to enclose the second circuit board and the first metal tape.

3. The inner module assembly formed by a metal tape, according to claim 2, wherein the insulation seat further includes a second side wall which is extended from the bottom plate to oppose the first side wall, as well as a connecting wall which opposes the bottom plate and is connected between the first side wall and the second side wall, forming a holding space on the insulation seat.

4. The inner module assembly formed by a metal tape, according to claim 3, wherein the inner module assembly further includes a power supply unit which is disposed in the holding space, with the power supply unit being connected electrically with the circuit loop.

5. The inner module assembly formed by a metal tape, according to claim 3, wherein the inner module assembly further includes a loudspeaker which is connected electrically with the circuit loop, and the connecting wall of the insulation seat further includes a rabbet for disposing the loudspeaker.

6. The inner module assembly formed by a metal tape, according to claim 3, wherein the circuit loop further includes a third circuit board which is extended from the first circuit board and is enclosed in the second side wall, with the third circuit board being connected electrically with the first circuit board.

7. The inner module assembly formed by a metal tape, according to claim 6, wherein the inner module assembly further includes a second metal tape which is enclosed in the second side wall to fix the third circuit board.

8. The inner module assembly formed by a metal tape, according to claim 7, wherein the second metal tape further includes a second extension section which is extended to the outside of the third circuit board, whereas a second cut-off face is formed on the second extension section away from an edge of the third circuit board to be exposed on a surface of the insulation seat.

9. The inner module assembly formed by a metal tape, according to claim 7, wherein the inner module assembly further includes a metallic fixing plate which is opposite to the second metal tape, and the third circuit board is disposed between the second metal tape and the metallic fixing plate.

10. The inner module assembly formed by a metal tape, according to claim 9, wherein the second metal tape is further extended with a snap part, and the snap part avoids the third circuit board and the metallic fixing plate followed by being bent over, enabling the third circuit board and the metallic fixing plate to be fixed on the second metal tape by the snap part.

* * * * *